United States Patent
Gill

[19]

[11] Patent Number: 6,127,045
[45] Date of Patent: Oct. 3, 2000

[54] MAGNETIC TUNNEL JUNCTION DEVICE WITH OPTIMIZED FERROMAGNETIC LAYER

[75] Inventor: Hardayal Harry Singh Gill, Portola Valley, Calif.

[73] Assignee: International Business Machines Corporation, Armonk, N.Y.

[21] Appl. No.: 09/078,898

[22] Filed: May 13, 1998

[51] Int. Cl.[7] ..................................................... H01F 1/00
[52] U.S. Cl. ........................ 428/611; 427/131; 427/132; 428/332; 428/635; 428/638; 428/668; 428/669; 428/670; 428/678; 428/679; 428/680; 428/682; 428/693; 428/697; 428/699; 428/900; 428/928
[58] Field of Search ..................................... 427/131, 132; 428/693, 697, 699, 638, 668, 670, 678, 679, 680, 682, 332, 900, 928, 611, 635, 669

[56] References Cited

U.S. PATENT DOCUMENTS

| | | | |
|---|---|---|---|
| 4,663,607 | 5/1987 | Kitada et al. | 338/32 |
| 5,206,590 | 4/1993 | Dieny et al. | 324/252 |
| 5,606,478 | 2/1997 | Chen et al. | 360/126 |
| 5,650,958 | 7/1997 | Gallagher et al. | 365/173 |
| 5,668,688 | 9/1997 | Dykes et al. | 360/113 |

FOREIGN PATENT DOCUMENTS

WO95/03604  2/1995  WIPO ............................... G11B 5/66

*Primary Examiner*—Bernard Pianalto
*Attorney, Agent, or Firm*—William D. Gill

[57] ABSTRACT

A magnetic tunnel junction (MTJ) device is usable as a magnetic field sensor in magnetic disk drives or as a memory cell in a magnetic random access (MRAM) array. The MTJ device has a "pinned" ferromagnetic layer whose magnetization is oriented in the plane of the layer but is fixed so as not to be able to rotate in the presence of an applied magnetic field in the range of interest, a "free" ferromagnetic layer whose magnetization is able to be rotated in the plane of the layer relative to the fixed magnetization of the pinned ferromagnetic layer, and an insulating tunnel barrier layer located between and in contact with both ferromagnetic layers. The pinned ferromagnetic layer is pinned by interfacial exchange coupling with an adjacent antiferromagnetic layer. A high spin polarization ferromagnetic layer ($Ni_{40}$—$Fe_{60}$) is placed near the tunnel barrier layer in both the pinned and free layers to enhance the magnetoresistive effect. The undesirable positive magnetostriction coefficient of the $Ni_{40}$—$Fe_{60}$ layers is canceled by placing a negative magnetostriction layer ($Ni_{90}$—$Fe_{10}$) of the appropriate thickness adjacent to each $Ni_{40}$—$Fe_{60}$ layer.

25 Claims, 6 Drawing Sheets

MAGNETIC TUNNEL JUNCTION DEVICE WITH OPTIMIZED FERROMAGNETIC LAYER

BACKGROUND OF THE INVENTION

1. Field of the Invention

This invention relates in general to magnetic tunnel junction transducers for reading information signals from a magnetic medium and, in particular, to a magnetic tunnel junction sensor with enhanced magnetoresistance, and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

Figure 1:
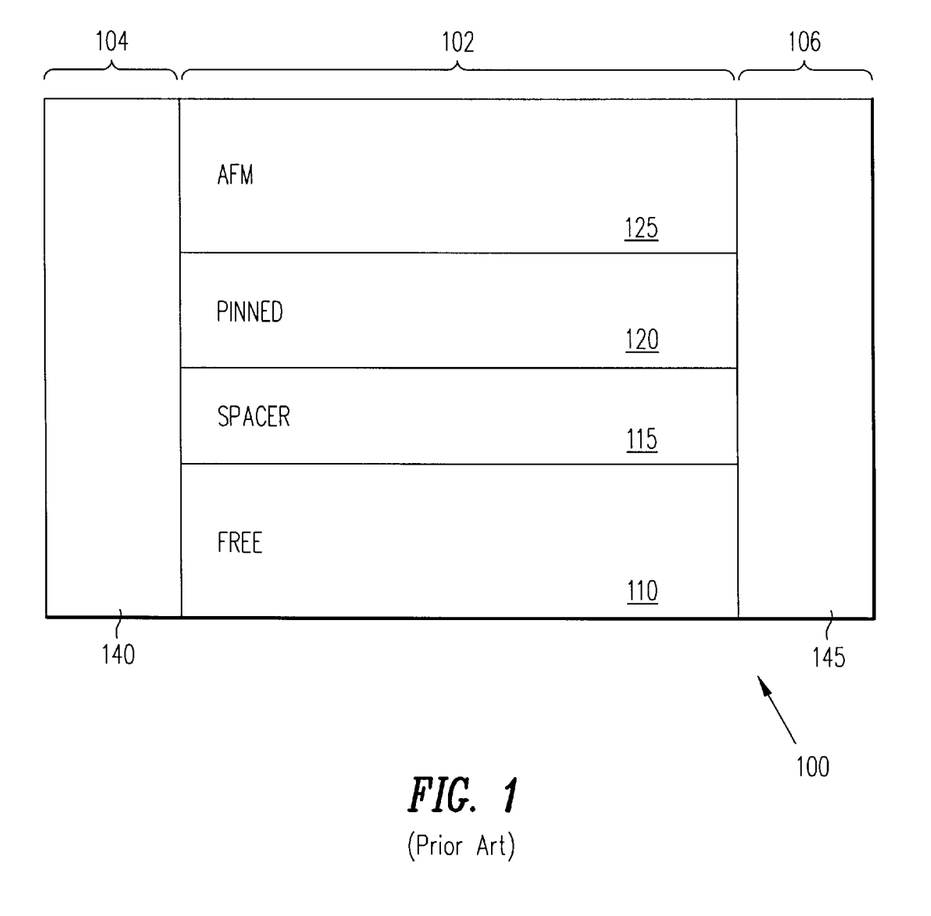
FIG. 1 is an air bearing surface view, not to scale, of a prior art SV sensor.

GMR sensors using only two layers of ferromagnetic material (e.g., Ni—Fe) separated by a layer of non-magnetic material (e.g., copper) are generally referred to as spin valve (SV) sensors manifesting the SV effect. FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Leads 140 and 145 formed in the end regions 104 and 106, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

Figure 2:
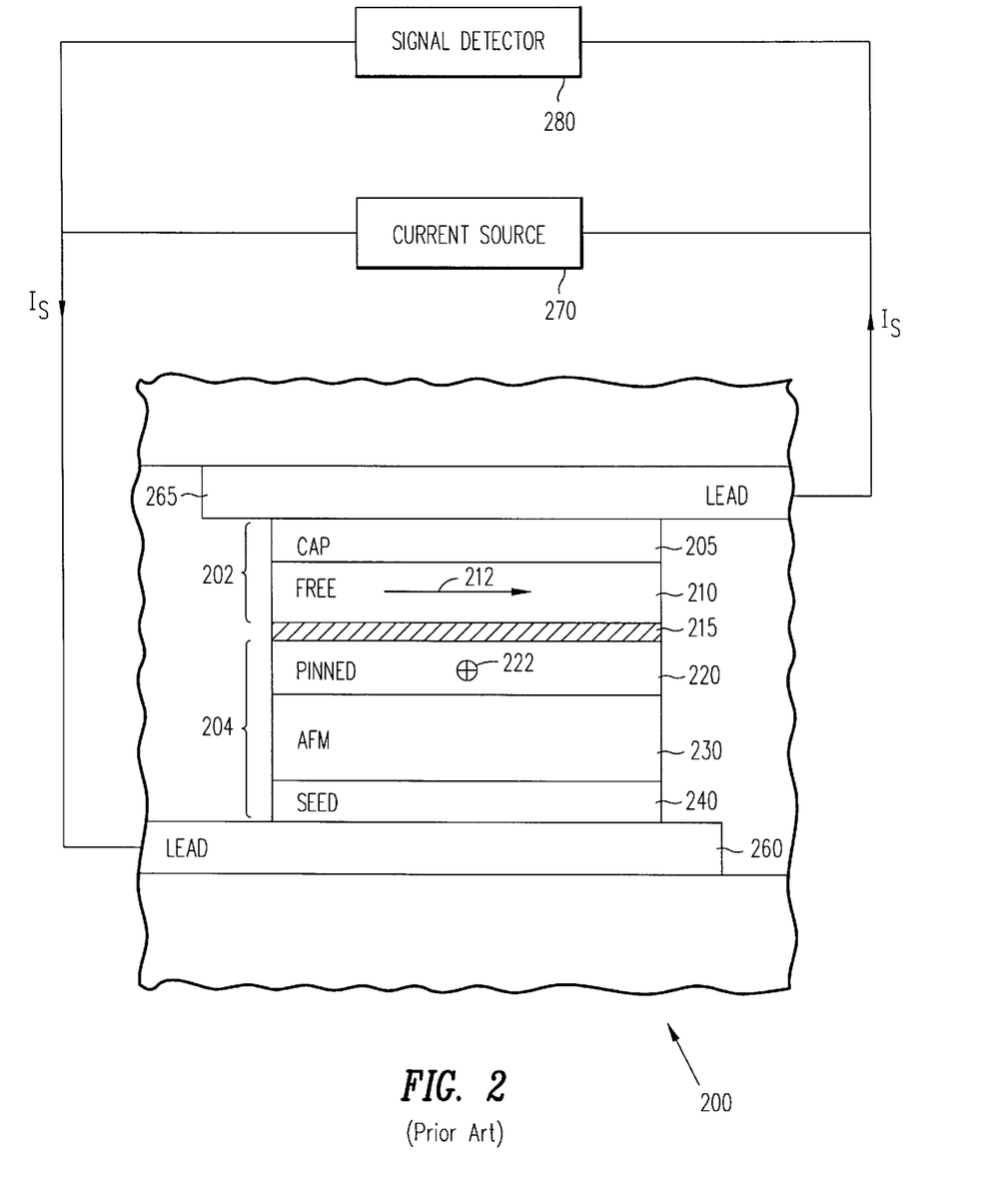
FIG. 2 is an air bearing surface view, not to scale, of a prior art magnetic tunneling junction sensor.

FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

Ferromagnetic materials most suitable for use as the pinned and free layers separated by the insulating tunnel barrier material are materials with high spin polarization coefficients. Materials with high spin polarization coefficients near the tunneling junction are known to achieve higher magnetoresistance coefficients in MTJ sensors. A problem with using some of the known materials that achieve the higher magnetoresistance coefficients is that magnetostriction coefficients can also be high in these materials. In the presence of stress in the MTJ sensor layers, the high magnetostriction coefficients can result in high uniaxial anisotropy fields in the pinned layer which can act to cancel part of the exchange field from the AFM layer resulting in reduced stability of the MTJ sensor especially at elevated operating temperatures. Also in the presence of stress, the high manetostriction coefficients can result in high anisotropy fields in the free layer which reduces the sensitivity of the free layer to rotate in the presence of a signal field. In order to eliminate these undesirable effects caused by magnetostriction, previous MTJ sensors have used ferromagnetic materials such as permalloy which are known to have very small magnetostriction coefficients, but which also have smaller magnetoresistance coefficients.

What is needed is a structure for an MTJ sensor which allows the use of materials for the pinned and free layers that result in the highest magnetoresistive coefficients without degradation in sensitivity and thermal stability due to uncontrolled effects from magnetostrictive properties of these materials.

SUMMARY OF THE INVENTION

It is an object of the present invention to disclose an improved magnetoresistive tunnel junction (MTJ) sensor with the pinned and free layers formed of optimum material for achieving high magnetoresistive coefficients.

It is a another object of the present invention to disclose an MTJ sensor structure providing high sensitivity and thermal stability by reducing or eliminating undesirable effects of high magnetostriction coefficient materials.

In accordance with the principles of the present invention, there is disclosed an MTJ sensor having an antiparallel (AP) coupled laminated pinned layer comprising a first ferromagnetic layer made of a high spin polarization, positive magnetostriction coefficient material, a second ferromagnetic layer made of a negative magnetostriction material and an antiparallel coupling (APC) layer disposed between said first and second ferromagnetic layers. A ferromagnetic free layer comprising a first sub-layer made of a high spin polarization, positive magnetostriction coefficient material adjacent to a second sub-layer made of a negative magnetostriction material is separated from the first ferromagnetic layer of the laminated pinned layer by a spacer layer formed of an insulating tunnel barrier material adjacent to the first sub-layer of the free layer. An antiferromagnetic (AFM) layer adjacent to the second ferromagnetic layer of the laminated pinned layer is exchange coupled to the laminated pinned layer fixing the magnetization direction of the pinned layer.

The use of a high spin polarization material adjacent to both sides of the insulating tunnel barrier spacer layer results in the MTJ sensor having a high magnetoresistance coefficient. The use of a negative magnetostriction coefficient material for the second ferromagnetic layer of the laminated pinned layer and for the second sub-layer of the free layer results in the net magnetostriction coefficient being near zero for both the pinned layer and the free layer of the MTJ sensor. The thicknesses of the positive magnetostriction and the negative magnetostriction materials are adjusted to yield the near zero net magnetostriction coefficients in both the pinned and free layers.

Having the AFM layer exchange coupled to an AP-coupled laminated pinned layer provides additional advantages by improving the exchange field that fixes the pinned layer magnetization. Because of the antiparallel orientation of the magnetizations of the first and second ferromagnetic layers, the net magnetic moment of the laminated pinned layer is small. As a consequence, the exchange field is correspondingly large because it is inversely proportional to the net magnetic moment. Reduction or elimination of the net magnetostriction coefficient of the pinned layer by matching the positive and negative magnetostriction effects of the first and second ferromagnetic layers, respectively, eliminates stress induced uniaxial anisotropy fields in the pinned layer from subtracting from the exchange field from the AFM layer.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
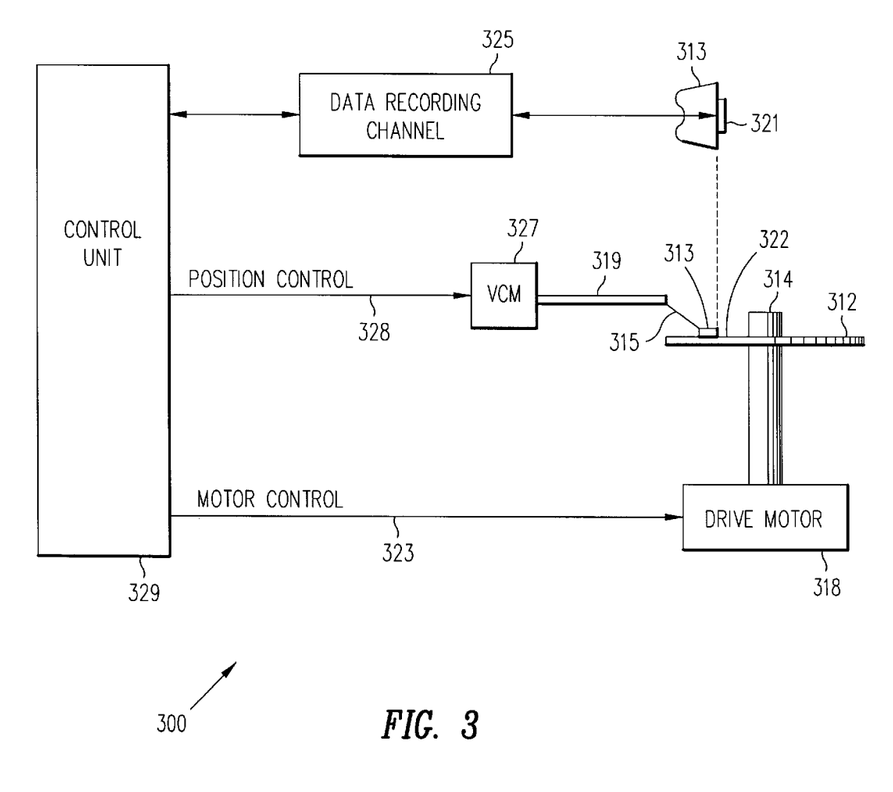
FIG. 3 is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the MTJ sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counterbalances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328. The control signals on line 328 provide the desired current profiles to optimally move and position the slider 313 to the desired data track on the disk 312. Read and write signals are communicated to and from the read/write heads 321 by means of the recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
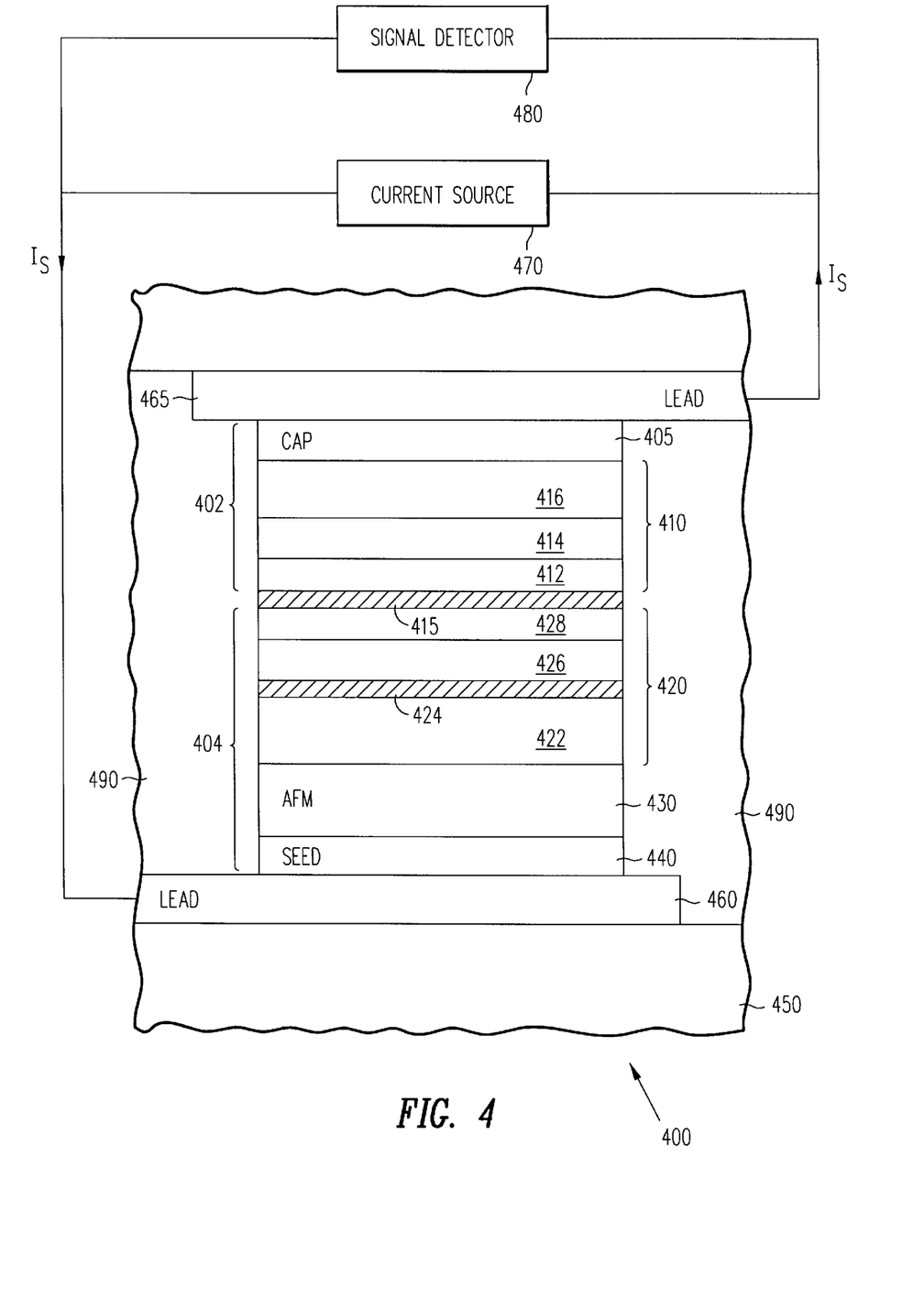
FIG. 4 is an air bearing surface view, not to scale, of the preferred embodiment of a magnetic tunneling junction sensor according to the present invention.

FIG. 4 shows an air bearing surface (ABS) view of an MTJ sensor 400 according to the preferred embodiment of the present invention. The MTJ sensor 400 comprises a first electrode 404, a second electrode 402 and a tunnel barrier layer 415 disposed between the first electrode 404 and the second electrode 402. The first electrode 404 comprises a laminated pinned layer 420, adjacent to the tunnel barrier layer 415, an AFM layer 430 adjacent to the laminated pinned layer 420, and a seed layer 440. The second electrode 402 comprises a free layer 410 adjacent to the tunnel barrier layer 415, and a cap layer 405 adjacent to the free layer 415.

The laminated pinned layer 420 is an AP-coupled multi-layer structure comprising a first ferromagnetic layer 426, a second ferromagnetic layer 422, and an APC layer 424 to provide antiparallel coupling between the first and second ferromagnetic layers 426, 422. An interface layer 428 adjacent to the tunnel barrier layer 415 may be used to enhance the magnetoresistance coefficient, or alternatively, may not be used. The AFM layer 430 is exchange coupled to the pinned layer 420 providing an exchange field to pin the magnetization direction of the AP-coupled pinned layer structure perpendicular to the ABS. The seed layer 440 is a layer deposited to modify the crystallographic texture or grain size of the subsequent layers, and may not be needed.

The free layer 410 comprises an interface layer 412 adjacent to the tunnel barrier layer, a first sub-layer 414 adjacent to the interface layer, and a second sub-layer 416 adjacent to the first sub-layer. The magnetization of the free layer 410 is oriented parallel to the ABS and is free to rotate in the presence of a signal magnetic field.

Lead layers 460, 465 adjacent to the first electrode 404 and the second electrode 402 provide electrical connection for the flow of sensing current $I_S$ from a current source 470 to the MTJ sensor 400. A signal detector 480 which is electrically connected to the leads 460, 465 senses the change in the tunneling current due to changes induced in the free layer 410 by the signal magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. The signal detector 480 preferably includes a digital recording channel such as a PRML channel as is known to those skilled in the art. The signal detector 480 also includes other supporting circuitries such as a preamplifier (electrically placed between the sensor and the channel) for conditioning the sensed resistance changes as is known to those skilled in the art.

The MTJ sensor is fabricated in a magnetron sputtering or an ion beam sputtering system to sequentially deposit the multilayer structure shown in FIG. 4. The sputter deposition is carried out in the presence of a longitudinal or transverse magnetic field of about 40 Oe. The bottom lead layer 460 formed of gold (Au) having a thickness of about 100–500 Å is deposited on a substrate 450 of preferably $Al_2O_3$. The seed layer 440 comprises a sub-layer formed of Ta having a thickness of about 30–50 Å deposited on the lead 460 and a template ferromagnetic layer of Ni—Fe having a thickness of about 40 Å deposited on the Ta sub-layer to encourage the growth of the AFM layer 430. The AFM layer 430 formed of $Mn_{50}$—$Fe_{50}$ having a thickness of about 100 Å is deposited on the seed layer 440.

The AP-coupled pinned layer 420 comprising the second ferromagnetic layer 422, the APC layer 424, the first ferromagnetic layer 426, and the interface layer 428 are sequentially deposited on the AFM layer 430. The first ferromagnetic layer 426 having a thickness in the range of about 20–40 Å is formed of $Ni_{40}$—$Fe_{60}$, a high spin polarization, ferromagnetic material having properties that yield a high magnetoresistance coefficient but also exhibiting a positive magnetostriction coefficient. The second ferromagnetic layer 422 is formed of $Ni_{90}$—$Fe_{10}$, a ferromagnetic material having a negative magnetostriction coefficient. The ratio of the thicknesses of the first ferromagnetic layer 426 and the second ferromagnetic layer 422 is chosen so that the net magnetostriction of the pinned layer 420 is approximately zero. The known magnetostriction coefficient values suggest that the $Ni_{90}$—$Fe_{10}$ layer thickness will be about twice the thickness of the $Ni_{40}$—$Fe_{60}$ layer. The APC layer 424 is formed of preferably ruthenium (Ru) having a thickness of about 6 Å. The interface layer 428 is formed of cobalt (Co) having a thickness of about 5 Å.

The tunnel barrier layer 415 is formed of $Al_2P_3$ by depositing and then plasma oxidizing an 8–20 Å aluminum (Al) layer adjacent to the interface layer 428.

The free layer 410 comprising the interface layer 412, the first sub-layer 414, and the second sub-layer 416 are sequentially deposited on the tunnel barrier layer 415. The interface layer 412 is formed of a Co layer having a thickness of about 5 Å. The first sub-layer 414 formed of $Ni_{40}$—$Fe_{60}$ having a thickness in the range of about 20–40 Å has a high spin polarization and a positive magnetostriction coefficient. The second sub-layer 416 formed of $Ni_{90}$—$Fe_{10}$ having a negative magnetostriction coefficient is deposited directly on the first sub-layer. The ratio of the thicknesses of the first and second sub-layers 414, 414 is chosen so that the net magnetostriction of the free layer 415 is approximately zero. The $Ni_{90}$—$Fe_{10}$ layer thickness will be about twice the thickness of the $Ni_{40}$—$Fe_{60}$ layer. The cap layer 405 formed of Ta having a thickness of about 50 Å is deposited on the second sub-layer to complete the active portion of MTJ sensor 400.

The top lead 465 formed of gold (Au) having a thickness of 100–500 Å is deposited over the cap layer 405. An insulating layer 490 formed of $Al_2O_3$ deposited between the bottom lead 460 and the top lead 465 provides electrical insulation between the leads and prevents shunting of the sense current around MTJ sensor 400.

The saturation values of the magnetostriction coefficients are $25\times10^{-6}$ for $Ni_{40}$—$Fe_{60}$ and $-12\times10^{-6}$ for $Ni_{90}$—$Fe_{10}$, while the saturation values of the magnetic flux densities are 16000 Gauss and 8000 Gauss for $Ni_{40}$—$Fe_{60}$ and $Ni_{90}$—$Fe_{10}$, respectively. As a result, if the physical layer thickness of the $Ni_{90}$—$Fe_{10}$ layer is twice the thickness of the $Ni_{40}$—$Fe_{60}$ layer, the structure will yield near zero magnetostriction and near zero net flux density for the antiparallel (AP) pinned structure. Having both the net magnetostriction and the net flux density near zero will improve the thermal stability and the magnetic stability of the MTJ sensors.

While $Ni_{40}$—$Fe_{60}$ was the preferred composition of the first ferromagnetic layer 426 and of the first sub-layer 414 of the pinned layer 420 and the free layer 410, respectively, a composition range may be used expressed as $Ni_x$—$Fe_y$, where $35\% \leq x \leq 55\%$, $45\% \leq y \leq 65\%$, and $x+y=100\%$.

Also, while $Ni_{90}$—$Fe_{10}$ was the preferred composition of the second ferromagnetic layer 422 and of the second sub-layer 416 of the pinned layer 420 and the free layer 410, respectively, a composition range may be used expressed as $Ni_a$—$Fe_b$, where $85\% \leq a \leq 95\%$, $5\% \leq b \leq 15\%$, and $a+b=100\%$.

The tunnel magnetoresistance coefficient is proportional to the product of the magnetic flux densities of the free and pinned layers. Therefore, higher flux density materials are desired for the application as the free and pinned layers in MTJ sensors. A material with very high saturation flux density is $Co_{30}$—$Fe_{70}$ with a saturation flux density of 24000 Gauss and a saturation magnetostriction constant of $45\times10^{-6}$. This material can be combined with a negative magnetostriction material such as Co, or alternatively, $Ni_{90}$—$Fe_{10}$ to achieve near zero magnetostriction in an MTJ sensor according to the present invention.

Figure 5:
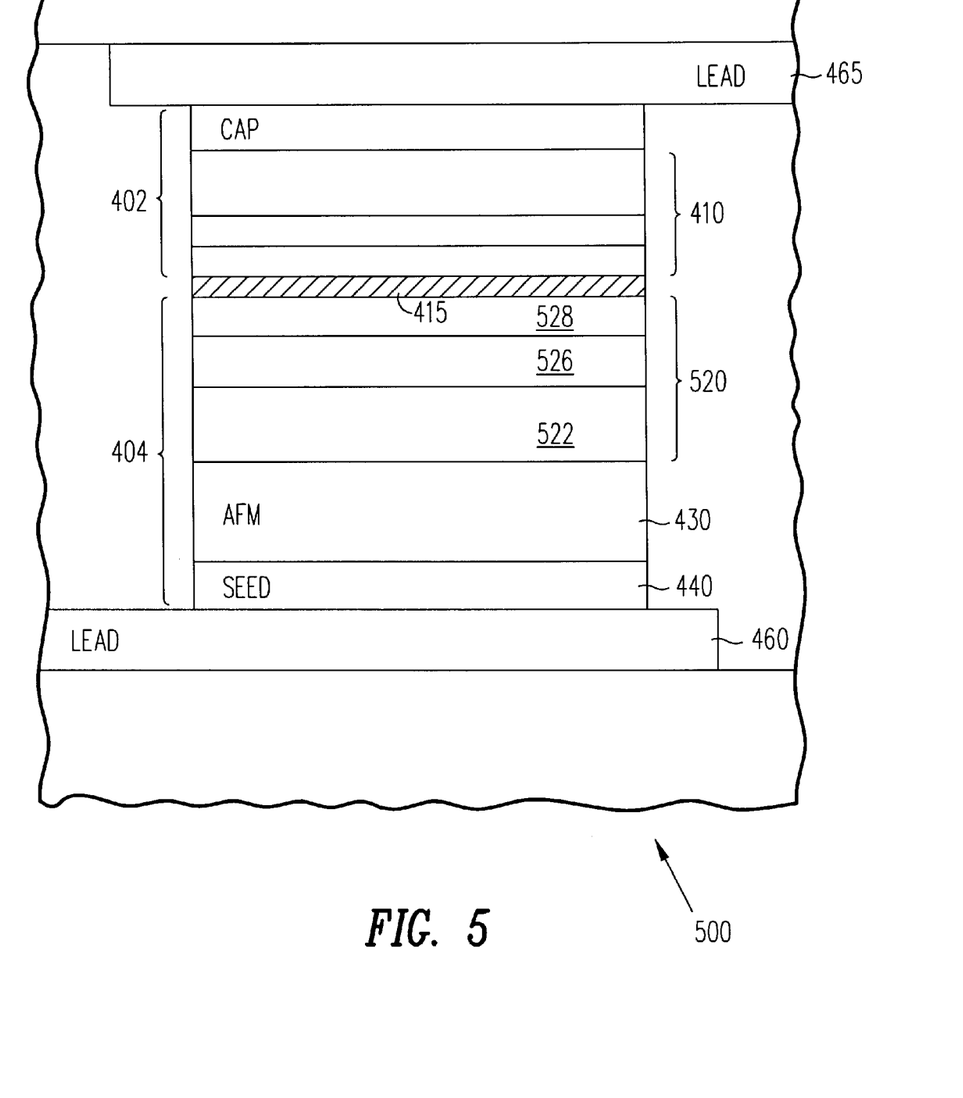
FIG. 5 is an air bearing surface view, not to scale, of an alternate embodiment of a magnetic tunneling junction sensor according to the present invention.

FIG. 5 shows an ABS view of a MTJ sensor 500 according to an alternate embodiment of the present invention. MTJ sensor 500 is substantially the same as MTJ sensor 400 except that pinned layer 520 is a laminated multilayer ferromagnetic structure instead of the AP-coupled pinned layer 420. Pinned layer 520 comprises a second ferromagnetic layer 522, a first ferromagnetic layer 526, and an interface layer 528 deposited sequentially on the AFM layer 430. The AFM layer 430 is exchange coupled to the pinned layer 520 providing an exchange field to fix the direction of magnetization of the pinned layer 520 perpendicular to the ABS. The first ferromagnetic layer 526 is formed of $Ni_{40}$—$Fe_{60}$ having a thickness in the range of 20–40 Å. The second ferromagnetic layer 522 is formed of $Ni_{90}$—$Fe_{10}$ having a thickness approximately twice the thickness of the first ferromagnetic layer 526. The ratio of the thicknesses of the first and second ferromagnetic layers 526, 522 are chosen so that the net magnetostriction of the pinned layer 520 is zero. The interface layer 528 is formed of Co having a thickness of about 5 Å.

Figure 6:
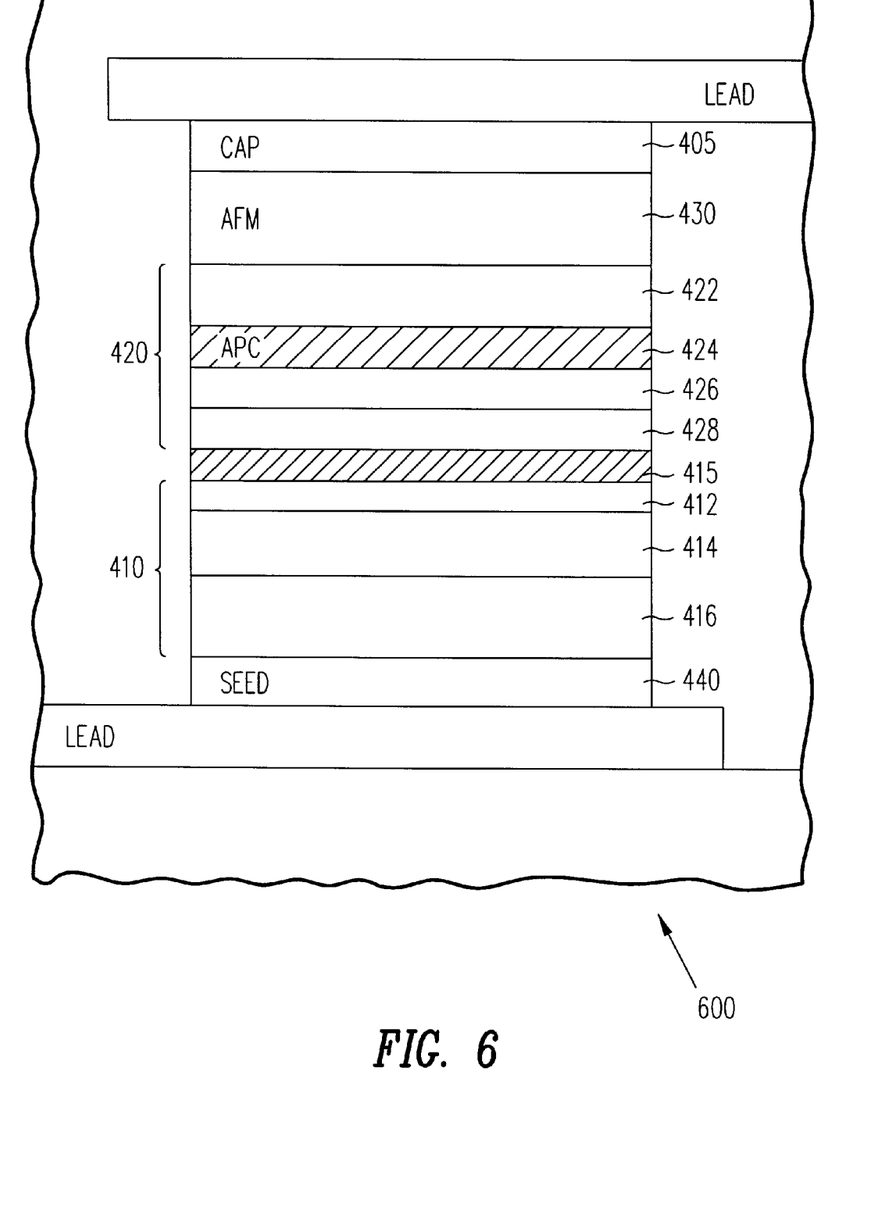
FIG. 6 is an air bearing surface view, not to scale, of another alternate embodiment of a magnetic tunneling junction sensor according to the present invention.

FIG. 6 is an ABS view of an MTJ sensor 600 according to another alternate embodiment of the present invention. In this embodiment, the layers forming the MTJ sensor 600 are deposited sequentially in reverse order to the deposition sequence used for the preferred embodiment. Free layer 410 is made by sequentially depositing the second sub-layer 416, the first sub-layer 414, and the interface layer 412 on the seed layer 440. The tunnel barrier layer 415 is deposited on the interface layer 412. The pinned layer 420 is deposited on the tunnel barrier layer 415. The pinned layer 420 is made by sequentially depositing the interface layer 428, the first ferromagnetic layer 426, the APC layer 424, and the second ferromagnetic layer 422 on the tunnel barrier layer 415. Alternatively, the AP-coupled pinned layer 420 may be replaced with the laminated pinned layer 520 comprising the interface layer 528, the first ferromagnetic layer 526, and the second ferromagnetic layer 522. The AFM layer 430 is deposited on the second ferromagnetic layer 422 and cap layer 405 is deposited on the AFM layer 430.

Alternative AFM layer 430 materials such as Ni—Mn, Pd—Mn, Pt—Mn, Pd—Pt—Mn, Ir—Mn, Rh—Mn, and Cr—Mn—Pt may also be used to fabricate MTJ sensors according to the present invention.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A magnetic tunnel junction (MTJ) sensor, comprising:
   an antiferromagnetic (AFM) layer;
   a pinned layer adjacent to said AFM layer, said AFM layer fixing the magnetization direction of said pinned layer, said pinned layer comprising:
      a first ferromagnetic layer of positive magnetostriction material;
      a second ferromagnetic layer of negative magnetostriction material in contact with said AFM layer; and
      an antiparallel (AP) coupling layer disposed between said first and second ferromagnetic layers;
   a free layer of ferromagnetic material; and
   a tunnel barrier layer disposed between said pinned layer and said free layer.

2. The MTJ sensor as recited in claim 1, wherein said first ferromagnetic layer is made of $Ni_{40}$—$Fe_{60}$ and said second ferromagnetic layer is made of $Ni_{90}$—$Fe_{10}$.

3. The MTJ sensor as recited in claim 2, wherein the thickness of said second ferromagnetic layer is twice the thickness of said first ferromagnetic layer.

4. The MTJ sensor as recited in claim 1, wherein said first ferromagnetic layer is made of $Ni_x$—$Fe_y$ where $35\% \leq x \leq 55\%$, $45\% \leq y \leq 65\%$, and $x+y=100\%$, and said second ferromagnetic layer is made of $Ni_a$—$Fe_b$ where $85\% \leq a \leq 95\%$, $5\% \leq b \leq 15\%$, and $a+b=100\%$.

5. The MTJ sensor as recited in claim 4, wherein said pinned layer further comprises an interface layer made of cobalt (Co) disposed between said first ferromagnetic layer and said tunnel barrier layer.

6. The MTJ sensor as recited in claim 1, wherein said first ferromagnetic layer is made of $Co_{30}$—$Fe_{70}$ and said second ferromagnetic layer is made of Co or $Ni_{90}$—$Fe_{10}$.

7. The MTJ sensor as recited in claim 1, wherein said AFM layer is made of $Mn_{50}$—$Fe_{50}$.

8. The MTJ sensor as recited in claim 1, wherein said AFM layer is chosen from a group of materials including Mn—Fe, Ni—Mn, Pd—Mn, Pt—Mn, Pd—Pt—Mn, Ir—Mn, Rh—Mn, and Cr—Mn—Pt.

9. The MTJ sensor as recited in claim 1, wherein said free layer comprises:

a first sub-layer of positive magnetostriction material adjacent to said tunnel barrier layer; and a second sub-layer of negative magnetostriction material adjacent to said first sub-layer.

10. The MTJ sensor as recited in claim 9, wherein said first sub-layer is made of $Ni_{40}$—$Fe_{60}$ and said second sub-layer is made of $Ni_{90}$—$Fe_{10}$.

11. The MTJ sensor as recited in claim 9, wherein said first sub-layer is made of $Ni_x$—$Fe_y$ where $35\% \leq x \leq 55\%$, $45\% \leq y \leq 65\%$, and $x+y=100\%$, and said second sub-layer is made of $Ni_a$—$Fe_b$ where $85\% \leq a \leq 95\%$, $5\% \leq b \leq 15\%$, and $a+b=100\%$.

12. The MTJ sensor as recited in claim 11, wherein said free layer further comprises an interface layer made of cobalt (Co) disposed between said first sub-layer and said tunnel barrier layer.

13. The MTJ sensor as recited in claim 9, wherein said first sub-layer is made of $Co_{30}$—$Fe_{70}$ and said second sub-layer is made of Co or $Ni_{90}$—$Fe_{10}$.

14. A magnetic tunnel junction (MTJ) sensor, comprising:

an antiferromagnetic (AFM) layer;

a pinned layer adjacent to said AFM layer, said AFM layer fixing the magnetization direction of said pinned layer, said pinned layer comprising:

a second ferromagnetic layer of negative magnetostriction material in contact with said AFM layer; and a first ferromagnetic layer of positive magnetostriction material in contact with said second ferromagnetic layer;

a free layer of ferromagnetic material; and a tunnel barrier layer disposed between said pinned layer and said free layer.

15. The MTJ sensor as recited in claim 14, wherein said first ferromagnetic layer is made of $Ni_{40}$—$Fe_{60}$ and said second ferromagnetic layer is made of $Ni_{90}$—$Fe_{10}$.

16. The MTJ sensor as recited in claim 15, wherein the thickness of said second ferromagnetic layer is twice the thickness of said first ferromagnetic layer.

17. The MTJ sensor as recited in claim 14, wherein said first ferromagnetic layer is made of $Ni_x$—$Fe_y$ where $35\% \leq x \leq 55\%$, $45\% \leq y \leq 65\%$, and $x+y=100\%$, and said second ferromagnetic layer is made of $Ni_a$—$Fe_b$ where $85\% \leq a \leq 95\%$, $5\% \leq b \leq 15\%$, and $a+b=100\%$.

18. The MTJ sensor as recited in claim 17, wherein said pinned layer further comprises an interface layer made of cobalt (Co) disposed between said first ferromagnetic layer and said tunnel barrier layer.

19. The MTJ sensor as recited in claim 14, wherein said first ferromagnetic layer is made of $Co_{30}$—$Fe_{70}$ and said second ferromagnetic layer is made of Co or $Ni_{90}$—$Fe_{10}$.

20. The MTJ sensor as recited in claim 14, wherein said AFM layer is made of $Mn_{50}$—$Fe_{50}$.

21. The MTJ sensor as recited in claim 14, wherein said AFM layer is chosen from a group of materials including Mn—Fe, Ni—Mn, Pd—Mn, Pt—Mn, Pd—Pt—Mn, Ir—Mn, Rh—Mn, and Cr—Mn—Pt.

22. The MTJ sensor as recited in claim 14, wherein said free layer comprises:

a first sub-layer of positive magnetostriction material adjacent to said tunnel barrier layer; and a second sub-layer of negative magnetostriction material adjacent to said first sub-layer.

23. The MTJ sensor as recited in claim 22, wherein said first sub-layer is made of $Ni_{40}$—$Fe_{60}$ and said second sub-layer is made from $Ni_{90}$—$Fe_{10}$.

24. The MTJ sensor as recited in claim 22, wherein said first sub-layer is made of $Ni_x$—$Fe_y$ where $35\% \leq x \leq 55\%$, $45\% \leq y \leq 65\%$, and $x+y=100\%$, and said second sub-layer is made of $Ni_a$—$Fe_b$ where $85\% \leq a \leq 95\%$, $5\% \leq b \leq 15\%$, and $a+b=100\%$.

25. The MTJ sensor as recited in claim 24, wherein said free layer further comprises an interface layer made of cobalt (Co) disposed between said first sub-layer and said tunnel barrier layer.

* * * * *